(12) United States Patent
Yoo et al.

(10) Patent No.: US 12,004,312 B2
(45) Date of Patent: Jun. 4, 2024

(54) DEFORMABLE DISPLAY DEVICE WITH SUPPORT STRUCTURE

(71) Applicant: SAMSUNG DISPLAY CO., LTD., Yongin-si (KR)

(72) Inventors: Jae Suk Yoo, Seoul (KR); Kyung Rok Ko, Suwon-si (KR); Young Su Kim, Gunpo-si (KR); Hyo Jin Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 22 days.

(21) Appl. No.: 17/664,382

(22) Filed: May 20, 2022

(65) Prior Publication Data
US 2023/0131358 A1  Apr. 27, 2023

(30) Foreign Application Priority Data

Oct. 27, 2021 (KR) .......................... 10-2021-0144880

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC ... H05K 5/0017; H05K 5/0217; G06F 1/1652
See application file for complete search history.

(56) References Cited

U.S. PATENT DOCUMENTS

| 9,818,961 | B2* | 11/2017 | Hiroki ..................... G09F 9/301 |
| 10,716,344 | B2 | 7/2020 | Dey et al. |
| 2013/0303048 | A1* | 11/2013 | Grossman ............... A63H 33/00 |
| | | | 446/486 |
| 2015/0189789 | A1* | 7/2015 | Suh ................... G02F 1/133385 |
| | | | 165/185 |
| 2017/0061836 | A1* | 3/2017 | Kim ...................... G06F 1/1626 |
| 2018/0014417 | A1* | 1/2018 | Seo ......................... H05K 1/189 |
| 2018/0049329 | A1* | 2/2018 | Seo ............................ E05D 3/18 |
| 2018/0160553 | A1* | 6/2018 | Yeh ........................ G06F 1/1681 |
| 2018/0164852 | A1* | 6/2018 | Lim ..................... H04M 1/0214 |
| 2018/0324964 | A1* | 11/2018 | Yoo ........................ G06F 1/1698 |
| 2018/0341293 | A1* | 11/2018 | Kim ....................... G06F 1/1652 |
| 2020/0084897 | A1* | 3/2020 | Shin ....................... H05K 5/0017 |
| 2021/0216108 | A1* | 7/2021 | Lee ........................ G06F 1/1652 |

(Continued)

FOREIGN PATENT DOCUMENTS

| KR | 10-1737155 | 5/2017 |
| KR | 10-2017-0064165 | 6/2017 |

(Continued)

*Primary Examiner* — Sagar Shrestha
(74) *Attorney, Agent, or Firm* — F. CHAU & ASSOCIATES, LLC

(57) ABSTRACT

A display device including a deformable display unit according to an embodiment includes: a display panel that can display images in a first direction and a supporting part positioned under the display panel. The supporting part includes a plurality of springs that are arranged in a second direction and extend in a third direction, and are interwoven with each other. The first direction, second direction, and third direction are substantially orthogonal to each other.

20 Claims, 17 Drawing Sheets

(56) References Cited

U.S. PATENT DOCUMENTS

| | | | | |
|---|---|---|---|---|
| 2021/0227704 A1* | 7/2021 | Bi | ............................ | B32B 15/20 |
| 2022/0063237 A1* | 3/2022 | Liu | ........................ | B32B 15/18 |
| 2022/0068170 A1* | 3/2022 | Han | ...................... | G06F 1/1624 |
| 2022/0254281 A1* | 8/2022 | Zhang | ..................... | G09F 9/301 |

FOREIGN PATENT DOCUMENTS

| | | |
|---|---|---|
| KR | 10-2018-0075054 | 7/2018 |
| KR | 10-1945985 | 2/2019 |
| KR | 10-2019-0066682 | 6/2019 |
| KR | 10-2164430 | 10/2020 |
| KR | 10-2021-0086844 | 7/2021 |

* cited by examiner

DEFORMABLE DISPLAY DEVICE WITH SUPPORT STRUCTURE

CROSS-REFERENCE TO RELATED APPLICATION

This application claims priority under 35 USC § 119 to Korean Patent Application No. 10-2021-0144880 filed in the Korean Intellectual Property Office on Oct. 27, 2021, the disclosure of which is incorporated by reference herein.

TECHNICAL FIELD

The present disclosure relates to a display device, and more specifically, to a deformable display device with a support structure.

DISCUSSION OF THE RELATED ART

Display devices have seen increased demand from consumers in recent times. Display devices are used to facilitate a connection between users and information. There has also been recent demand for more portable display devices, and display devices that may be deformed during use such as being folded, being rolled into a rolled shape, or being stretched like a rubber band, are being researched and developed. Since these display devices may be transformed into various shapes, it is possible to provide a display device with a large screen during use, as well as a small, portable form factor when not in use.

SUMMARY

The deformable display device such as the rollable display device includes a supporting part for supporting the display panel. Embodiments described herein describe systems and techniques for maintaining alignment between portions of the support part of the rollable display device, improving surface quality of the display device through a dense structure, and decreasing the weight of the display device. In addition, the described embodiments provide for structurally controlling a target curvature radius of the display device.

A display device according to an embodiment includes a deformable display unit, and further includes: a display panel that configured to display images in a first direction; and a supporting part positioned under the display panel, where the supporting part includes a plurality of springs that are interwoven with each other, are arranged in a second direction, and extend in a third direction, where the first direction, the second direction, and the third direction are substantially orthogonal to each other.

Each of the plurality of springs may have a coil a shape that is spirally wrapped around an imaginary column extending in the third direction.

The display unit is capable of being rolled or unfolded in the second direction.

A coil pitch of each of the plurality of springs may be equal to or greater than twice a diameter of the coil wiring.

A first surface of the plurality of springs facing the display panel may be flatter than a second surface opposite the first surface.

A first adhesive layer positioned between the first surface of the plurality of springs and the display panel may be further included.

As a ratio of a mean coil diameter to a diameter of the coil wiring of the plurality of springs increases, a curvature radius corresponding to when the display unit is fully rolled decreases.

When the display unit is fully rolled, outer surfaces of the springs that are alternately adjacent in the plurality of springs may be in contact with each other.

When the display unit is fully extended, inner surfaces of adjacent springs in the plurality of springs may be in contact with each other.

When the display unit is fully rolled, inner surfaces of adjacent springs in the plurality of springs may be in contact with each other.

When the display unit is fully extended, outer surfaces of the springs that are alternately adjacent in the plurality of springs may be in contact with each other.

The plurality of springs may include at least two springs of different sizes.

A spiral shape of a cross-section of at least a part of the plurality of springs may be a circle or a polygon.

The supporting part may further include a resin layer into which the plurality of springs is disposed.

A display unit capable of being rolled or unfolded in a first direction according to an embodiment includes: a display panela lower film part positioned under the display panel; and a supporting part positioned under the lower film part, where and the supporting part includes a plurality of springs arranged in the first direction.

Each of the plurality of springs may include a coil having a shape spirally wrapped around an imaginary column extending in a second direction, where the second direction is different from the first direction.

A coil pitch of each of the plurality of springs may be equal to or greater than twice a diameter of the coil wiring.

A first surface of the plurality of springs facing the display panel may be flatter than a second surface opposite the first surface.

An adhesive layer positioned between the first surface of the plurality of springs and the lower film part may be further included.

A display device according to an embodiment includes a display unit capable of being rolled or unfolded in a first direction, wherein the display unit includes: a display panel that can display images; and a supporting part positioned under the display panel, and wherein the supporting part includes a plurality of springs arranged in the first direction, and wherein each of the plurality of springs extends in a form of a coil in a second direction different from the first direction.

According to embodiments, it is possible to maintain the alignment between portions of the supporting part of the rollable display device, improve the surface quality of the display device through a dense structure, and decrease the weight of the display device. In addition, the target curvature radius of the display device may be structurally controllable.

BRIEF DESCRIPTION OF THE DRAWINGS

The above and other aspects and features of the present disclosure will become more apparent by describing in detail embodiments thereof with reference to the attached drawings, wherein.

DETAILED DESCRIPTION OF THE EMBODIMENTS

Figure 1:
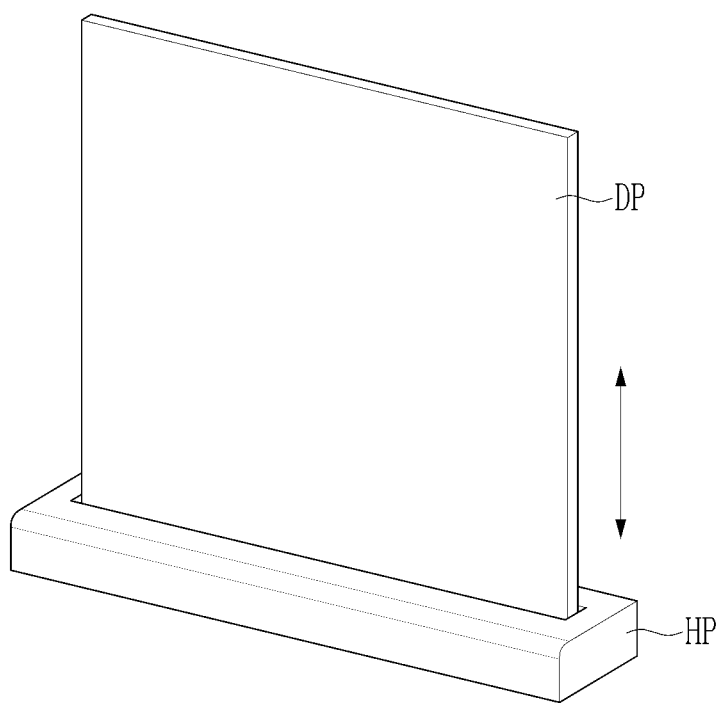
FIG. 1 is a perspective view of a display device according to an embodiment.

The present inventive concepts will be described more fully hereinafter with reference to the accompanying drawings, in which embodiments of the inventive concepts are shown. As those skilled in the art will appreciate that the described embodiments may be modified in various different ways without departing from the spirit or scope of the present inventive concepts.

Throughout the specification, like reference symbols in the drawings may denote like elements, and to the extent that a description of an element has been omitted, it may be understood that the element is at least similar to corresponding elements that are described elsewhere in the specification. Further, since sizes and thicknesses of constituent members shown in the accompanying drawings are illustrated according to one embodiment and the present inventive concepts are not necessarily limited to the illustrated sizes and thicknesses. In the drawings, for better understanding and ease of description, the thicknesses of some layers and areas may be exaggerated. While there are many other embodiments within the scope of the disclosure that are not as shown, the relative sizes, shapes, angels, etc. shown in the figures may represent at least one embodiment of the present disclosure and therefore should be considered part of the disclosure.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

In addition, an x direction, a y direction, and a z direction described in the specification may be expressed as a first direction, a second direction, and a third direction (the order may be changed), and each direction may mean different directions.

A display device according to an embodiment is described with reference to FIG. 1 to FIG. 3.

Figure 2:
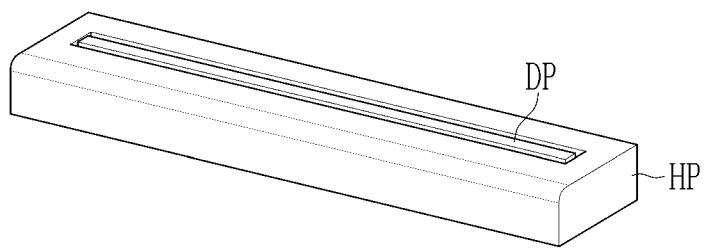
FIG. 2 is a view that shows a state in which a display unit of a display device according to an embodiment is rolled up and accommodated in a housing part.
Figure 3:
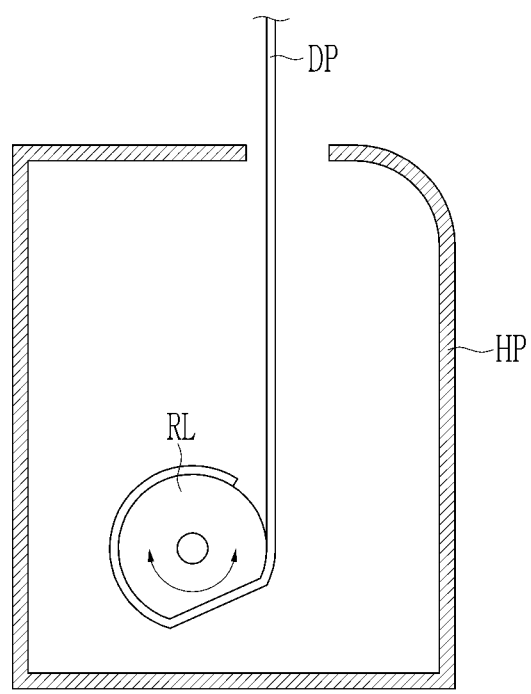
FIG. 3 is a view that shows a method in which a display unit is wound or unwound by a roller positioned inside a receiving part of a display device according to an embodiment.

FIG. 1 is a perspective view of a display device according to an embodiment, FIG. 2 is a view that shows a state in which a display unit of a display device according to an embodiment is rolled up and accommodated in a housing part, and FIG. 3 is a view that shows a method in which a display unit is wound or unwound by a roller positioned inside a receiving part of a display device according to an embodiment.

Referring to FIG. 1, a display device according to an embodiment includes a display part DP and a housing part HP. The display part DP is a component that displays an image, and may include a display element and a circuit and wiring for driving the display element. The display device according to one embodiment may be a rollable display device, and the display part DP may be wound or unfolded. The term "wound" in this specification may also be expressed as "rolled".

The housing part HP is a housing in which the display part DP may be accommodated. The display part DP may be rolled up and accommodated in the housing part HP, and may be unfolded to display an image outside the housing part HP.

FIG. 1 shows a state in which the display part DP is unfolded. FIG. 2 shows the state in which the display part DP is rolled up and accommodated in the housing part HP. FIG. 3 shows the process of rolling or unwinding the display part DP by the roller RL positioned inside the housing part HP. As shown in FIG. 3, the roller RL is positioned inside the housing part HP, and the display part DP may be positioned during, for example, non-use or storage. The display part DP may be wound or unwound on the roller RL. For example, when the display part DP is completely wound on the roller RL, as shown in FIG. 2, the display part DP may be accommodated in the housing part HP. When the display part DP is completely unfolded from the roller RL as shown in FIG. 1, the display part DP is positioned outside the housing part HP and may display the image.

As shown in FIG. 1 to FIG. 3, the display part DP of the rollable display device is wound or unwound on the roller RL, so it must be flexible.

Hereinafter, the detailed structure of the display part DP according to an embodiment is described with reference to FIG. 4 to FIG. 9.

Figure 4:
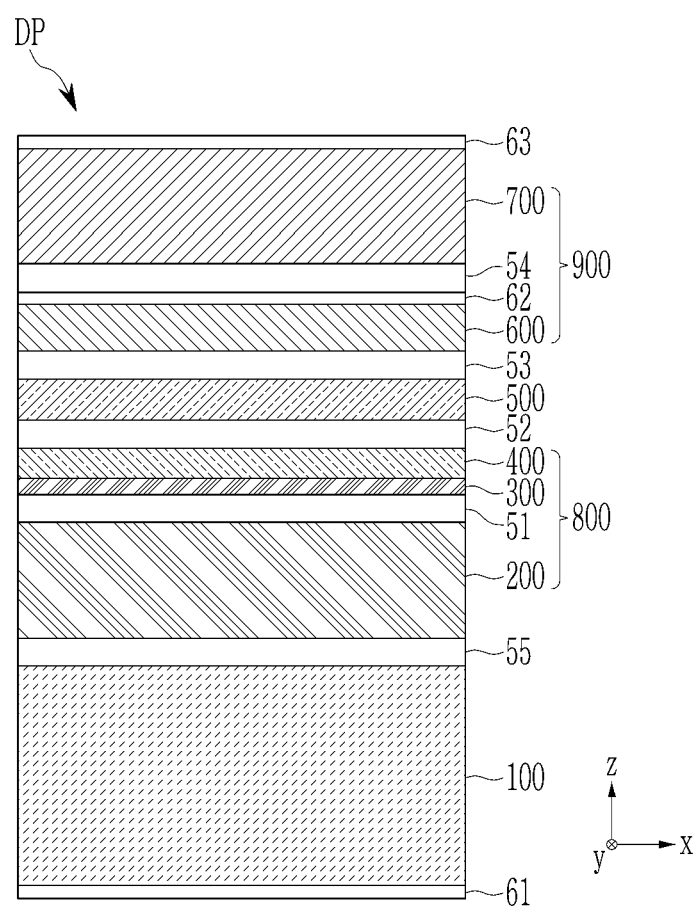
FIG. 4 is a cross-sectional view of a display device according to an embodiment.

FIG. 4 is a cross-sectional view of a display device according to an embodiment.

Referring to FIG. 4, the display part DP of the display device according to an embodiment may include a display panel 500, a lower film part 800, an upper film part 900, and a supporting part 100.

The display panel 500 may include a plurality of transistors and a display element connected thereto. The display element may include, for example, a light-emitting element such as an organic light emitting diode. In the embodiment shown in FIG. 4, the display panel 500 may display the image by sending light in the z direction, that is, from the display panel 500 toward the upper side where the upper film part 900 is positioned.

The lower film part 800 includes at least one first lower film 400, and may further include a second lower film 200 positioned below the first lower film 400. The first lower film 400 and the second lower film 200 may function to protect the display panel 500.

The first lower film 400 may be a film including a polymer such as a polyimide (PI).

The second lower film 200 may include a polymer resin such as one or more of: a polyether block amide (PEBA), polyethylene terephthalate (PET), poly(butylene terephthalate) (PBT), polycarbonate (PC), polyethylene naphthalate (PEN), polystyrene (PS), polymethyl methacrylate (PMMA), polyvinylchloride (PVC), polyethersulfone (PES), polypropylene (PP), and/or polyamide (PA).

An adhesive layer 51 may be positioned between the first lower film 400 and the second lower film 200, and an adhesive layer 52 may be positioned between the display panel 500 and the first lower film 400. The adhesive layers 51 and 52 may include, for example, a Pressure Sensitive Adhesive (PSA).

The lower film part 800 may further include a light blocking part 300. The light blocking part 300 may include a light blocking material such as carbon black. The light blocking part 300 may be positioned between the first lower film 400 and the second lower film 200, but the position is not necessarily limited thereto. For example, the light blocking part 300 may be positioned directly below the first lower film 400 to be in contact with the lower surface of the first lower film 400.

According to an embodiment, the second lower film 200 and/or the light blocking part 300 may be omitted, and in this case, the adhesive layer 51 may also be omitted. In addition, a cushion layer may be positioned instead of the first lower film 400. The cushion layer may include an elastic material such as silicone or urethane.

The upper film part 900 includes at least one first upper film 600, and may further include a second upper film 700 positioned above the first upper film 600. Both the first upper film 600 and the second upper film 700 may be transparent, and may function to protect the display panel 500.

The first upper film 600 may include a polymer such as a polyimide (PI).

The second upper film 700 may include a polymer resin such as one or more of: polyether block amide (PEBA), polyethylene terephthalate (PET), poly(butylene terephthalate) (PBT), polycarbonate (PC), polyethylene naphthalate (PEN), polystyrene (PS), polymethylmethacrylate (PMMA), polyvinylchloride (PVC), polyethersulfone (PES), polypropylene (PP), and/or polyamide (PA).

An adhesive layer 53 may be positioned between the display panel 500 and the first upper film 600, and an adhesive layer 54 may be positioned between the first upper film 600 and the second upper film 700. The adhesive layers 53 and 54 may be optically transparent adhesive layers. For example, the adhesive layers 53 and 54 may include an Optically Clear Adhesive (OCA), an Optically Clear Resin (OCR), or a Pressure Sensitive Adhesive (PSA).

A coating layer 62 may be positioned on the upper surface of the first upper film 600, and a coating layer 63 may be positioned on the upper surface of the second upper film 700. The coating layers 62 and 63 may be a hard coating layer or an anti-fingerprint coating layer. The coating layers 62 and/or 63 may be omitted.

According to an embodiment, the second upper film 700 may be omitted, and in this case, the adhesive layer 54 may also be omitted. In addition, the first upper film 600 may be an anti-reflection film. The anti-reflection film may reduce reflection of external light incident from the top of the display device.

The stacked structure of the display part DP other than the display panel 500 shown and described in FIG. 4 is an example embodiment, and may have various other stacked structures.

The supporting part 100 supports the display panel 500 and may allowing the display part DP to be rolled or unfolded. This will be described in detail below.

An adhesive layer 55 may be positioned between the supporting part 100 and the lower film part 800. The adhesive layer 55 may include, for example, a Pressure Sensitive Adhesive (PSA).

A coating layer 61 may be positioned on the underside of the supporting part 100. The coating layer 61 may be a fingerprint coating layer.

The structure of the supporting part 100 of the display device according to an embodiment is described with reference to FIG. 5 to FIG. 9.

Figure 5:
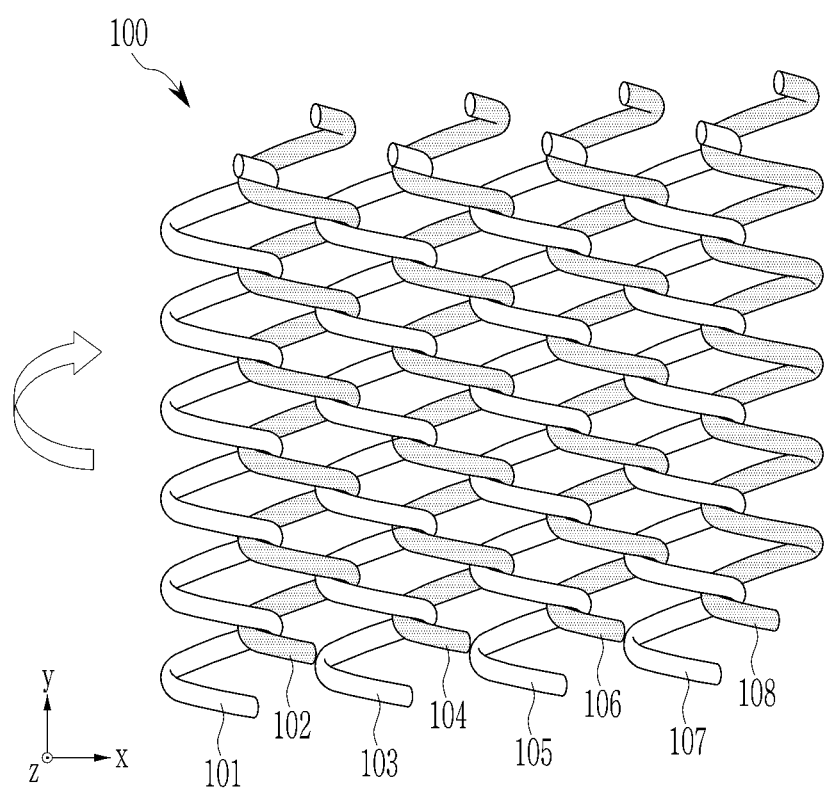
FIG. 5 is a top plan view of a supporting part of a display device according to an embodiment.

FIG. 5 is a top plan view of a supporting part of a display device according to an embodiment.

Referring to FIG. 5, the supporting part 100 according to one embodiment includes a plurality of springs (101, 102, . . . , 108) arranged in one direction, for example, in the x direction when being viewed on an x-y plane vertical normal to the z direction, and interwoven with each other. Although eight springs are illustrated as examples in FIG. 5 and subsequent drawings, the number of springs 101, 102, . . . , 108 is not necessarily limited thereto and may vary.

Each spring 101, 102, . . . , 108 may be a columnar coil spring. That is, each of the springs 101, 102, . . . , 108 may include a coil in a form of spirally wrapping around an axis extending substantially in the y direction. The springs (101, 102, . . . , 108) of this structure are called springs extending in the y direction.

The display part DP according to one embodiment may be rolled or unfolded about an axis that is parallel to the y direction as indicated by the arrow in FIG. 5. That is, the display part DP may be rolled or unfolded in the x direction.

The springs 101, 102, . . . , 108 may include materials such as SUS, aluminum, a carbon composite material, but are not necessarily limited thereto.

Figure 6:
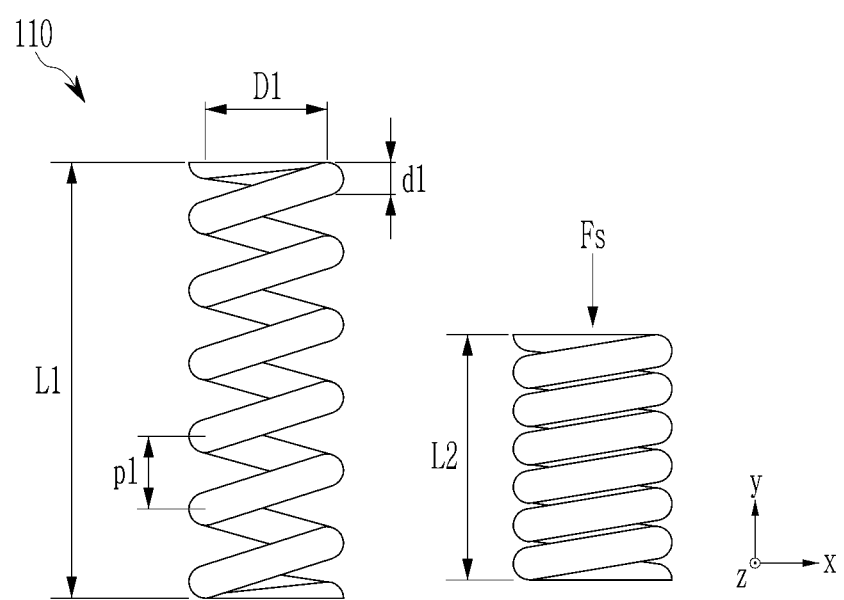
FIG. 6 is a view that shows a spring included in a supporting part of a display device according to an embodiment.

FIG. 6 shows the spring included in the supporting part 100 of the display device according to an embodiment.

Referring to FIG. 6, at least one spring 110 of each of the springs 101, 102, . . . , 108 shown in FIG. 5 has a characteristic that it may be stretched or compressed in the y-direction. For example, the springs shown in FIG. 5 may be compressed when they are elongated, when being not included in the display device.

In a state where no force is applied to the free spring 110, the length in the y direction of a predetermined number of the coils of one spring 110 may be L1, and in this case, a coil pitch p1 of the spring 110 may be larger than the coil wiring diameter d1 (e.g., a diameter of a cross section of the coil) of the spring. The coil pitch p1 of the spring 110 refers to the distance between two adjacent coils in the extending direction of the spring.

In a state in which a compressing force Fs is applied to the spring 110 in the y direction and the spring 110 is compressed, the length in the y direction of the same predetermined number of the coils of the spring 110 may be L2 smaller than L1. At this time, the coil pitch of the spring 110 is smaller than the initial coil pitch p1, and when the spring 110 is maximally compressed, the coil pitch of the spring 110 may be substantially equal to or larger than the coil wiring diameter d1 of the spring.

The mean coil diameter D1 of each spring 110 may be constant along the y direction, but is not necessarily limited thereto, and may gradually increase or decrease along the y direction, or may change regularly or irregularly within a certain range.

Figure 7:
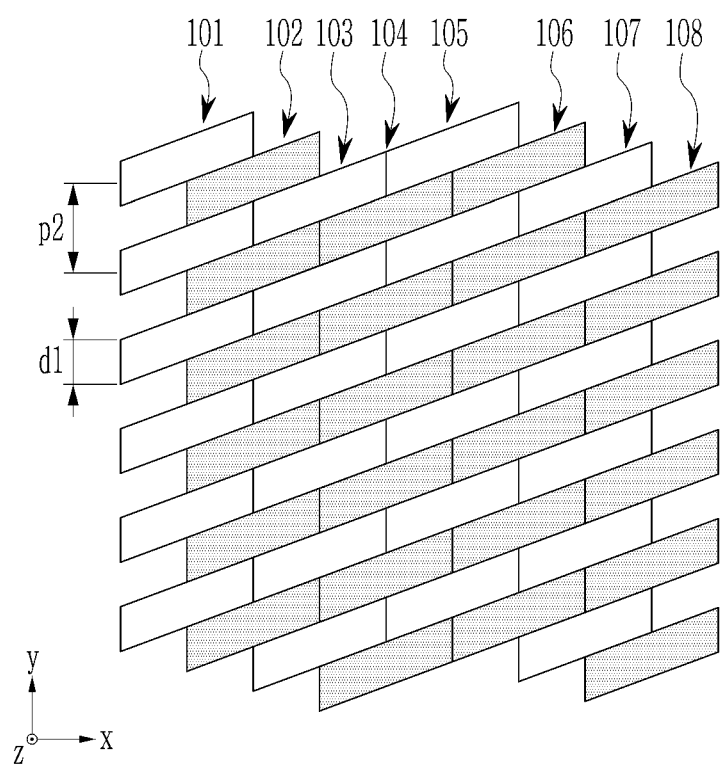
FIG. 7 is a top plan view of a plurality of springs included in a supporting part of a display device according to an embodiment.
Figure 8:
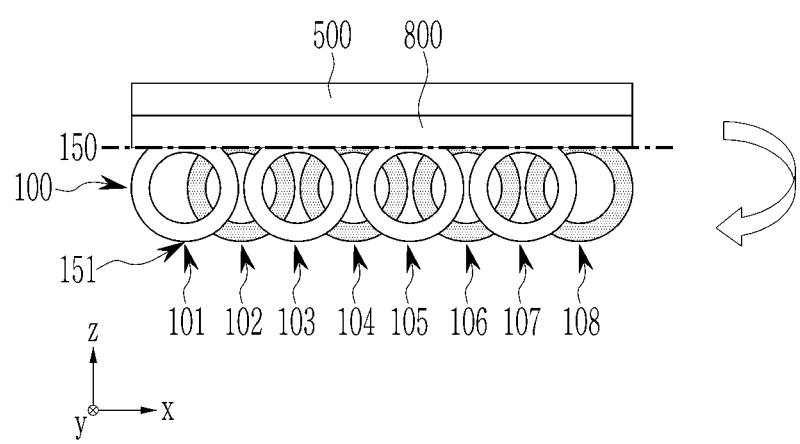
FIG. 8, FIG. 9, FIG. 10, and FIG. 11 are cross-sectional views of a plurality of springs included in a supporting part of a display device according to an embodiment.
Figure 9:
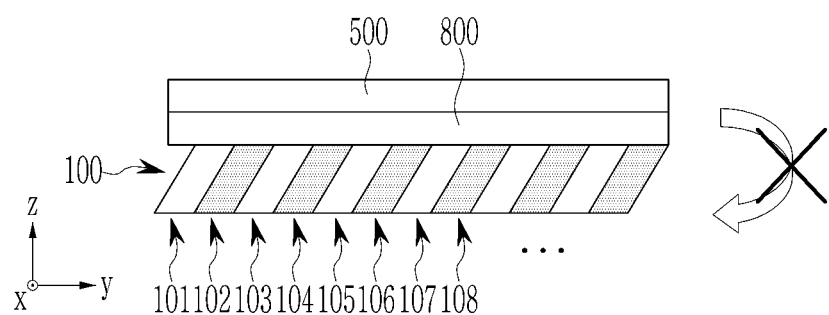

FIG. 7 is a top plan view of a plurality of springs included in a supporting part of a display device according to an embodiment, FIG. 8 is a cross-sectional view of a plurality of springs included in a supporting part of a display device according to an embodiment, and FIG. 9 is a cross-sectional view of a plurality of springs included in a supporting part of a display device according to an embodiment.

Referring to FIG. 7 and FIG. 8, in a plurality of springs 101, 102, . . . , 108 included in the supporting part 100 of the display part DP according to an embodiment, as shown in FIG. 5, the adjacent springs (101, 102, . . . , 108 may be intertwined.

If a plurality of springs 101, 102, . . . , 108 have a uniform shape, the coil pitch p2 in the y direction of each spring 101, 102, . . . , 108 may be larger than the coil wiring diameter d1 of the spring (e.g., the cross sectional diameter of the coil) 101, 102, . . . , 108 and may be approximately twice the coil wiring diameter d1 or slightly larger than this. Particularly, when the coil pitch p2 in they direction of each spring 101, 102, . . . , 108 is approximately twice the coil wiring diameter d1 of the spring 101, 102, . . . , 108, a plurality of springs 101, 102, . . . , 108 of the supporting part 100 forms a dense structure in the y direction to improve the surface quality of the display device. In addition, it is easy to maintain alignment between a plurality of springs 101, 102, . . . , 108 constituting the structure of the supporting part 100 of the display device.

In FIG. 7, Although the coil of each spring 101, 102, . . . , 108 is inclined in both the x direction and the y direction on the x-y plane, the shape is not necessarily limited thereto and may be approximately parallel to the x direction.

Referring to FIG. 8, the surface of the plurality of springs 101, 102, . . . , 108 included in the supporting part 100 facing the display panel 500, that is, the first surface 150 in contact with the lower film part 800, may be flatter than the second surface 151 that is the opposite surface thereto.

An upper part positioned at the center of each of a plurality of springs 101, 102, . . . , 108 has a shape cut in the x direction, so that the first surface 150 is not uneven and may be substantially flat unlike the second surface 151. For example, the upper part of the plurality of springs 101, 102, . . . , 108 that contacts the lower film part 800 may be cut so as to form a wider, flat contact with the lower film part 800.

The first surface 150 of a plurality of springs 101, 102, . . . , 108 may be formed through a cutting or polishing process. During the cutting or polishing process, a plurality of springs 101, 102, . . . , 108 are extended in the x direction to prevent tilting of the springs 101, 102, . . . , 108.

On the first surface 150 of a plurality of springs 101, 102, . . . , 108 cut or polished, the adhesive layer 55 such as the PSA as shown in FIG. 4 above-described may be positioned. A plurality of springs 101, 102, . . . , 108 may be attached to the lower surface of the lower film part 800 through the adhesive layer 55.

The arrow shown on the right side of FIG. 8 means the same direction as the arrow shown in FIG. 5 previously described.

As such, by making the upper surface of the supporting part 100 a flat surface, the surface of the display device may be flat rather than uneven, and the surface quality may be further improved.

FIG. 9 shows the cross-sectional view of the display device viewed from a different side from FIG. 8. Compared with FIG. 8, referring to FIG. 9, the display device according to an embodiment may be rolled or unfolded about an axis parallel to the y direction as indicated by the arrow in FIG. 8, but may not be rolled or unfolded about an axis parallel to the x direction as indicated by the arrow marked by X in FIG. 9. That is, the display part DP may not be rolled or unfolded in the y direction. For example, the display part DP may not be rolled in such a direction that compresses coils of the springs, due to the dense structure. Rather, the display part DP may be rolled in a direction such that the coils further overlap. Particularly, in embodiments where the coil pitch p2 in the y direction of a plurality of springs 101, 102, . . . , 108 is approximately twice the coil wiring diameter d1 of the springs 101, 102, . . . , 108, because a plurality of springs 101, 102, . . . , 108 of the supporting part 100 form the dense structure in the y direction, as shown in FIG. 9, it is not rolled or unfolded in the y direction, so it is possible to implement the display device that is rolled or unfolded only in one direction (the x direction in the present embodiment).

As the support structure included in the supporting part 100, the springs 101, 102, . . . , 108 has an empty inner space where the coil wiring is wound, it is possible to reduce the weight of the display device by implementing the lightweight supporting part 100.

Next, the structure of the supporting part 100 of the display device according to an embodiment will be described with reference to FIG. 10 and FIG. 11 along with the above-described drawings.

Figure 10:
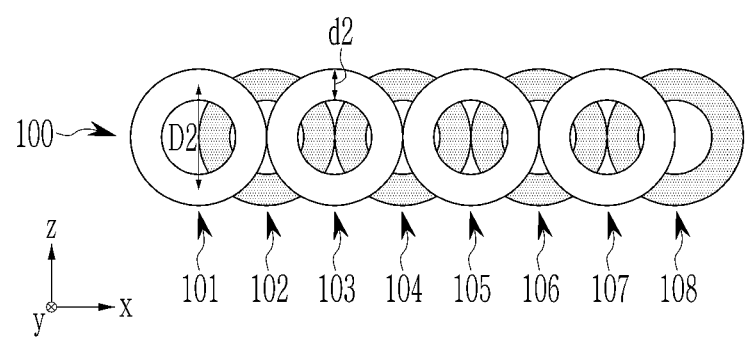
Figure 11:
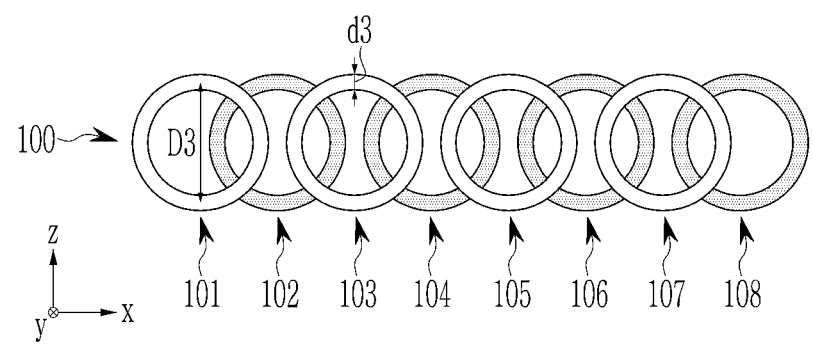

FIG. 10 and FIG. 11 are cross-sectional views of a plurality of springs included in a supporting part of a display device according to an embodiment.

By adjusting the mean coil diameter D2 and D3 of each spring 101, 102, . . . , 108 and the coil wiring diameter d2 and d3 of the spring, the rolling degree of the display part DP including the display panel 500, that is, the degree of the curvature radius when being rolled, may be controlled.

Specifically, as the ratio D2/d2 or D3/d3 of the spring mean coil diameter D2 and D3 to the coil wiring diameter d2 and d3 of the spring increases, the curvature radius when the display part DP is maximally wound or rolled may be reduced. Conversely, as the ratio D2/d2 or D3/d3 of the spring mean coil diameter D2 and D3 to the coil wiring diameter d2 and d3 of the spring decreases, the curvature radius when the display part DP is wound or rolled to the maximum may be increased. For example, it may be possible to wind the display part DP more tightly when the spring mean coil diameter D2 is large, as there may be more empty space to utilize during the winding.

For example, as shown in FIG. 10 and FIG. 11, when the mean coil diameters D2 and D3 of a plurality of springs 101, 102, . . . , 108 of the supporting part 100 are approximately equal to each other, the curvature radius of the display unit including the supporting part 100 having the large coil wiring diameter d2 may be greater than the curvature radius of the display unit including the supporting part 100 having the small coil wiring diameter d3. This is because the degree of the changeable length in the x direction of a plurality of springs 101, 102, . . . , 108 of the supporting part 100 in FIG. 10 is smaller than the degree of the changeable length in the x direction of a plurality of springs 101, 102, . . . , 108 of the supporting part 100 in FIG. 11.

As the minimum curvature radius increases, it may be said that the degree of the rolling of the display device is small. For example, when the degree of rolling is small, the display device may not be wound as tightly.

In this way, by controlling the mean coil diameter D2 and D3 of the springs 101, 102, . . . 108 included in the supporting part 100 of the display device and the coil wiring diameter d2 and d3 of the spring, it is possible to structurally control the target curvature radius of the display part DP including the display panel 500.

Next, the structure of the supporting part 100 of the display device of various rolling methods will be described with reference to FIG. 12 to FIG. 15 together with the previously described drawings.

Figure 12:
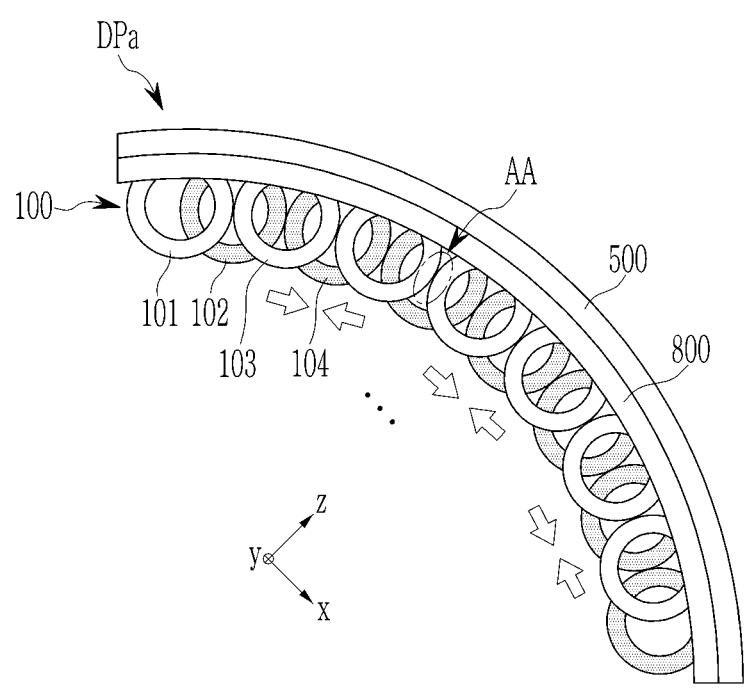
FIG. 12 is a cross-sectional view in a state in which a display device according to an embodiment is rolled.
Figure 13:
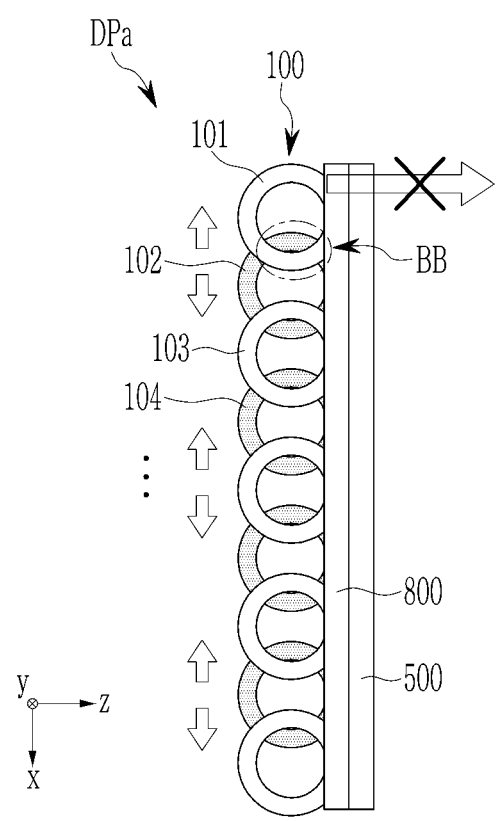
FIG. 13 is a cross-sectional view in an unfolded state of the display device according to an embodiment.

FIG. 12 is a cross-sectional view in a state in which a display device according to an embodiment is rolled, and FIG. 13 is a cross-sectional view in an unfolded state of the display device according to an embodiment.

Referring to FIG. 12 and FIG. 13, the display device according to an embodiment includes a display unit DPa, and the display unit DPa is similar to the display part DP above-described, however the display panel 500 side may be convex outward compared to the supporting part 100 side and the supporting part 100 may be rolled in the concave direction, and may not be rolled in the opposite direction. For example, the display unit DPa may be rolled in the illustrated concave direction, and may be unrolled to be relatively straight, but may not be able to be rolled in the opposite direction. This display unit Dpa is referred to as a display unit for out-rolling. For example, the display unit DPa may be rolled such that the display direction of the display unit DPa faces outside the roll, when it is in a rolled state.

Referring to FIG. 12, in a state that the display unit Dpa is fully rolled, as indicated by a plurality of arrows in the approximate x direction, a plurality of springs 101, 102, . . . are overlapped as much as possible in the x direction, so that the outer surfaces of the adjacent springs 101, 103, . . . /102, 104, . . . are in contact with each other as indicated by AA, and rolling to a smaller curvature radius may not be possible. Accordingly, it is possible to implement the target curvature radius of the display unit Dpa.

Referring to FIG. 13, in a state that the display unit Dpa is fully unfolded, as indicated by a plurality of arrows of the x direction, a plurality of springs (101, 102, . . . ) are extended to the maximum in the x direction, so that the spacing between the springs 101, 103, . . . /102, 104, . . . that are alternately adjacent is increased to the maximum, and the inside surfaces of the adjacent springs 101, 102, . . . may touch each other as indicated by BB. Accordingly, the display unit Dpa may not be rolled in the arrow direction indicated by X in FIG. 13.

To implement the display unit Dpa for such out-rolling, the supporting part 100 may be attached to the lower surface of the lower film part 800 in the state in which a plurality of springs 101, 102, . . . of the supporting part 100 are maximally extended in the x direction, that is, as shown in FIG. 13. For example, in this state, they may be attached while the inner surfaces of the adjacent springs 101, 102, . . . are in contact with each other. This may ensure that the maximum unfolding state of the display unit DPa corresponds to a relatively straight configuration.

If the supporting part 100 is attached to the lower surface of the lower film part 800 in the state the display panel 500 and the lower film part 800 are maximum rolled to be targeted, in a state in which a plurality of springs 101, 102, . . . of the supporting part 100 are maximally compressed in the x direction, that is, as shown in FIG. 12, they may be attached in the state where the outer surfaces of the springs 101, 103, . . . /102, 104, that are alternately adjacent touch each other and are no longer rolled.

Figure 14:
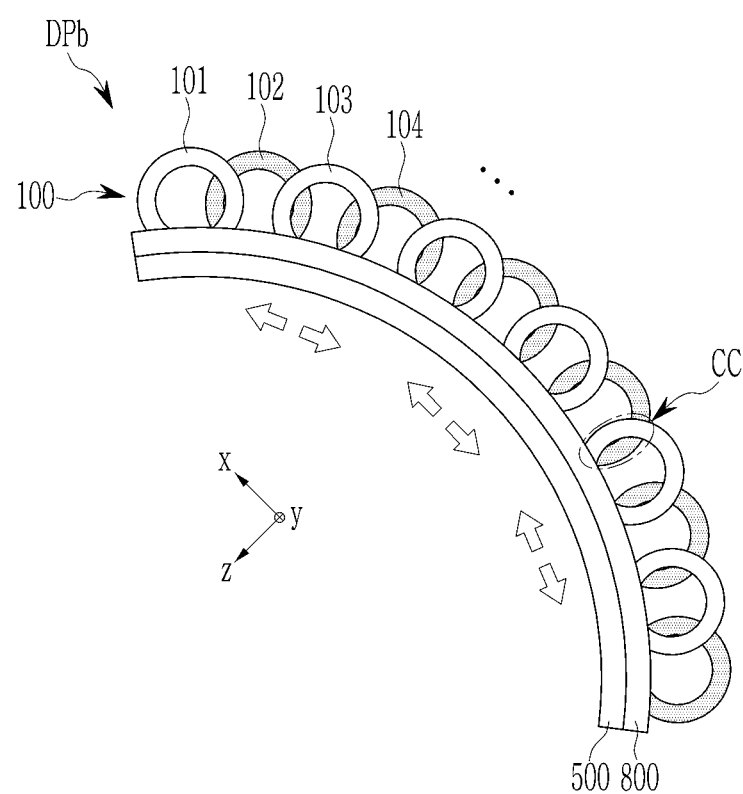
FIG. 14 is a cross-sectional view in a rolled state of a display device according to an embodiment.
Figure 15:
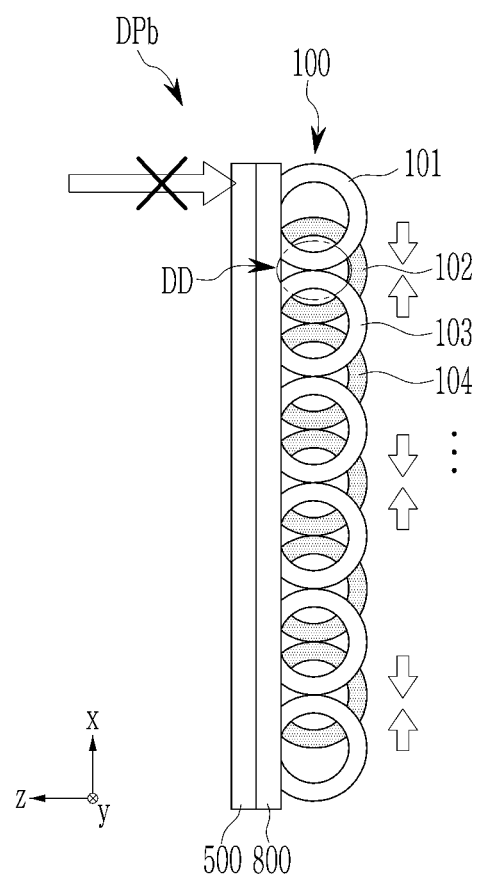
FIG. 15 is a cross-sectional view in an unfolded state of a display device according to an embodiment.

FIG. 14 is a cross-sectional view in a rolled state of a display device according to an embodiment, and FIG. 15 is a cross-sectional view in an unfolded state of a display device according to an embodiment.

Referring to FIG. 14 and FIG. 15, the display device according to an embodiment includes a display unit DPb and the display unit DPb is mostly the same as the display part DP described above, however the supporting part 100 side is convex outward compared to the display panel 500 side, and the display panel 500 side is rolled in the concave direction, and may not be rolled in the opposite direction. This display unit DPb is referred to as a display unit for in-rolling. For example, the display unit DPb may be rolled such that the display direction of the display unit DPb faces inside the roll, when it is in a rolled state.

Referring to FIG. 14, in the state that the display unit DPb is fully rolled, as indicated by a plurality of arrows in the approximate x direction, a plurality of springs 101, 102, . . . are extended to the maximum in the x direction, so that the spacing between the adjacent springs 101, 103, . . . /102, 104, . . . that are alternately adjacent is increased to the maximum, and the inner surfaces of the adjacent springs 101, 102, . . . may touch each other as indicated by CC. Accordingly, rolling to a curvature radius is impossible, so that the target curvature radius of the display unit DPb may be implemented.

Referring to FIG. 15, in the state that the display unit DPb is fully unfolded, as indicated by a plurality of arrows in the x direction, a plurality of springs 101, 102, . . . are compressed as much as possible in the x direction, and the outer surfaces of the springs 101, 103, . . . /102, 104, . . . that are alternately adjacent may touch each other as indicated by DD. Accordingly, the display unit (DPb) may not be rolled in the arrow direction indicated by X in FIG. 15.

To implement such an in-rolling display unit DPb, the supporting part 100 may be attached to the lower surface of the lower film part 800 in the maximally stretched state in which a plurality of springs 101, 102, . . . of the supporting part 100 are maximally compressed in the x direction. For example, the supporting part 100 may be attached in the state as shown in FIG. 15, while the outer surfaces of adjacent springs 101, 103, . . . /102, 104, . . . are in contact with each other.

If the supporting part 100 is attached to the lower surface of the lower film part 800 in the maximum rolled state targeting the display panel 500 and the lower film part 800, in the state in which a plurality of springs 101, 102, . . . of the supporting part 100 are extended to the maximum in the x direction, that is, as shown in FIG. 14, they may be attached in the state where the inner surfaces of adjacent springs 101, 102, . . . touch each other and are no longer rolled.

In this way, by attaching the supporting part 100 of the different springs 101, 102, . . . to the lower film part 800 under the display panel 500 depending on whether the display panel 500 is rolled or not, the display units of the rolling-type of the various types may be implemented.

Next, the structure of the supporting part included in the display device according to an embodiment will be described with reference to FIG. 16 together with the above-described drawings.

Figure 16:
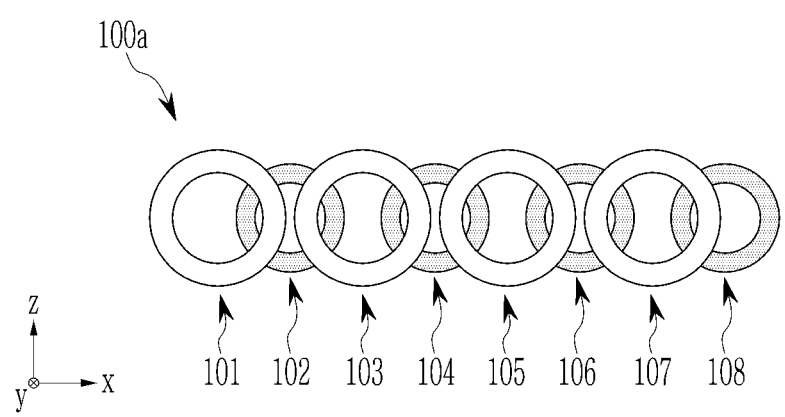
FIG. 16 and FIG. 17 are cross-sectional views of a supporting part of a display device according to an embodiment.

FIG. 16 is a cross-sectional view of a supporting part of a display device according to an embodiment.

Referring to FIG. 16, the supporting part 100a included in the display device according to an embodiment similar to the supporting part 100 described above, however a plurality of springs 101, 102, . . . may include at least two springs of different sizes. For example, as shown in FIG. 16, the neighboring springs (101, 102, . . . ) may have different sizes, and the springs 101, 103, . . . /102, 104, . . . that are alternately adjacent may have substantially the same size. That is, two springs with different sizes may be alternately arranged in the x direction. On the other hand, the springs of different sizes may be regularly arranged for each of two or more springs.

By arranging the springs of the various sizes in the various methods, it is possible to freely and precisely control the curvature radius of the target display unit.

Next, the structure of the supporting part included in the display device according to an embodiment will be described with reference to FIG. 17 together with the above-described drawings.

Figure 17:
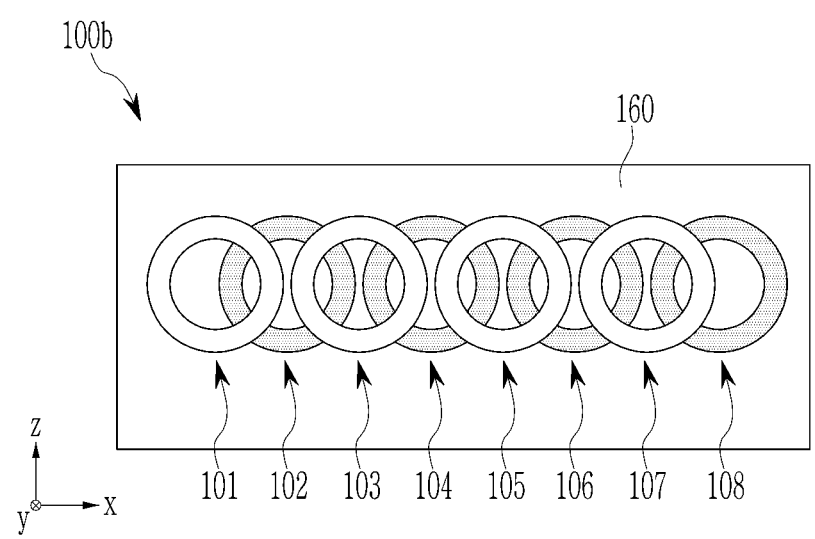

FIG. 17 is a cross-sectional view of a supporting part of a display device according to an embodiment.

Referring to FIG. 17, the supporting part 100b included in the display device according to an embodiment is similar to the supporting parts 100 and 100a described above, but may further include a resin layer 160. A plurality of springs 101, 102, . . . may be positioned inside the resin layer 160 and surrounded by the resin layer 160.

The resin layer 160 may include materials such as silicone or urethane, but is not necessarily limited thereto. For example, the resin layer 160 may be formed of flexible materials The cross-section shape of at least a portion of a plurality of springs 101, 102, . . . included in the supporting parts 100, 100a, 100b according to the several embodiments described above may be circular, but may be various polygons such as a triangle, a quadrangle, a pentagon, and a hexagon. That is, at least some of the plurality of springs 101, 102, . . . may include a coil spirally surrounding an imaginary circular cylinder or polygonal prism extending approximately in the y direction.

While the inventive concepts have been described in connection with what is presently considered to be practical embodiments, it is to be understood that the inventive concepts is not necessarily limited to the disclosed embodiments. On the contrary, it is intended to cover various modifications and equivalent arrangements included within the spirit and scope of the appended claims.

What is claimed is:

1. A display device including a deformable display unit, the display device comprising:
   a display panel configured to display images in a first direction; and
   a supporting part positioned under the display panel,
   wherein the supporting part includes a plurality of springs that are arranged in a second direction and extend in a third direction, wherein each spring of the plurality of springs has a coil shape, wherein each spring of the plurality of springs is wrapped around an adjacent spring of the plurality of springs, and wherein the first direction, the second direction, and the third direction are substantially orthogonal to each other.

2. The display device of claim 1, wherein:
   the coil shape of each of the plurality of springs is spirally wrapped around an imaginary column extending in the third direction.

3. The display device of claim 1, wherein:
   the display unit is configured to be rolled or unfolded in the second direction.

4. The display device of claim 3, wherein:
   a coil pitch of each of the plurality of springs is equal to or greater than twice a diameter of the coil wiring.

5. The display device of claim 1, wherein:
   a first surface of the plurality of springs is flatter than a second surface opposite the first surface, wherein the first surface is adjacent to the display panel.

6. The display device of claim 5, further comprising:
   a first adhesive layer positioned between the first surface of the plurality of springs and the display panel.

7. The display device of claim 1, wherein:
   as a ratio of a mean coil diameter to a diameter of the coil wiring of the plurality of springs increases, a curvature radius corresponding to when the display unit is fully rolled decreases.

8. The display device of claim 1, wherein:
   when the display unit is fully rolled, outer surfaces of the springs that are alternately adjacent in the plurality of springs are in contact with each other.

9. The display device of claim 8, wherein:
   when the display unit is fully extended, inner surfaces of adjacent springs in the plurality of springs are in contact with each other.

10. The display device of claim 1, wherein:
    when the display unit is fully rolled, inner surfaces of adjacent springs in the plurality of springs are in contact with each other.

11. The display device of claim 10, wherein:
    when the display unit is fully extended, outer surfaces of the springs that are alternately adjacent in the plurality of springs are in contact with each other.

12. The display device of claim 1, wherein:
    the plurality of springs includes at least two springs of different sizes.

13. The display device of claim 1, wherein:
    a spiral shape of at least a part of the plurality of springs a circle or a polygon.

14. The display device of claim 1, wherein:
    the supporting pan further includes a resin layer in which the plurality of springs is disposed.

15. A display unit capable of being rolled or unfolded in a first direction, comprising:
    a display panel;
    a lower film part positioned under the display panel; and
    a supporting part positioned under the lower film part,
    wherein the supporting part includes a plurality of springs arranged in the first directions, wherein each spring of the plurality of springs has a coil shape and wherein each spring of the plurality of springs is wrapped around an adjacent spring of the plurality of springs.

16. The display device of claim 15, wherein:
    the coil shape of each of the plurality of springs is spirally wrapped around an imaginary column extending in a second direction, wherein the second direction is different from the first direction.

17. The display device of claim 15, wherein:
    a coil pitch of each of the plurality of springs is equal to or greater than twice a diameter of the coil wiring.

18. The display device of claim 15, wherein:
a first surface of the plurality of springs is flatter than a second surface opposite the first surface, wherein the first surface is adjacent to the display panel.

19. The display device of claim 18, further comprising:
an adhesive layer positioned between the first surface of the plurality of springs and the lower film part.

20. A display device comprising:
a display unit capable of being rolled or unfolded in a first direction,
wherein the display unit includes:
a display panel that can display images; and
a supporting part positioned under the display panel, and wherein
the supporting part includes a plurality of springs arranged in the first direction, and
wherein each of the plurality of springs extends in a form of a coil in a second direction different from the first direction, and wherein each spring of the plurality of springs is wrapped around an adjacent spring of the plurality of springs.

\* \* \* \* \*